(12) United States Patent
Huang et al.

(10) Patent No.: US 10,897,244 B1
(45) Date of Patent: Jan. 19, 2021

(54) APPARATUSES AND METHODS FOR VOLTAGE DEPENDENT DELAY

(71) Applicant: MICRON TECHNOLOGY, INC., Boise, ID (US)

(72) Inventors: Zhi Qi Huang, Shanghai (CN); Wei Lu Chu, Shanghai (CN); Dong Pan, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/545,384

(22) Filed: Aug. 20, 2019

(51) Int. Cl.
| | |
|---|---|
| *G11C 7/00* | (2006.01) |
| *H03K 5/131* | (2014.01) |
| *H03K 5/134* | (2014.01) |
| *G11C 8/18* | (2006.01) |
| *G11C 5/14* | (2006.01) |
| *H03K 5/00* | (2006.01) |

(52) U.S. Cl.
CPC .............. *H03K 5/131* (2013.01); *G11C 5/145* (2013.01); *G11C 8/18* (2013.01); *H03K 5/134* (2014.07); *H03K 2005/00058* (2013.01); *H03K 2005/00195* (2013.01)

(58) Field of Classification Search
CPC ..................................................... G11C 7/222
USPC ......................................................... 365/194
See application file for complete search history.

(56) References Cited

U.S. PATENT DOCUMENTS

| | | | | |
|---|---|---|---|---|
| 6,414,556 B1* | 7/2002 | Mizuno | ................... | H03K 3/011 331/57 |
| 7,279,959 B1* | 10/2007 | Choy | ....................... | H02M 3/07 327/536 |
| 2009/0179666 A1* | 7/2009 | Chujo | .................... | H04L 25/028 326/30 |
| 2009/0256612 A1* | 10/2009 | Rho | ......................... | G11C 7/08 327/276 |
| 2014/0085011 A1* | 3/2014 | Choi | ....................... | H03L 7/099 331/8 |
| 2015/0194878 A1* | 7/2015 | Hu | ........................... | H02M 3/07 365/226 |

* cited by examiner

*Primary Examiner* — Hoai V Ho
(74) *Attorney, Agent, or Firm* — Dorsey & Whitney LLP

(57) ABSTRACT

Apparatus and methods are described for voltage dependent delay. An example apparatus includes an oscillator including a delay circuit that is configured to provide an oscillating output signal has a delay based on a delay of the delay circuit. The delay of the delay circuit is based on a voltage it receives. For example, the delay of the delay circuit increases for an increasing received voltage and decreases for a decreasing received voltage. As a result, the oscillating output signal provided by the oscillator is based on the received voltage. For example, a frequency of the oscillating output signal decreases for increasing received voltage and increases for decreasing received voltage. Described in another way, the frequency of the oscillating output signal is relatively low for relatively high received voltage and relatively high for relatively low received voltage.

20 Claims, 5 Drawing Sheets

APPARATUSES AND METHODS FOR VOLTAGE DEPENDENT DELAY

BACKGROUND

Semiconductor devices such as microcomputers, memories, gate arrays, among others, rely on power to operate. One or more power supplies are used to provide power to the semiconductor device. When power is initially provided to a semiconductor device, for example, at startup, internal voltages are developed that are used for operation. Proper operation of the circuits of the semiconductor device cannot begin until the internal voltages provided by the power supply are fully developed. Operation of circuits prior to when internal voltages are provided may result in the circuits failing to operate correctly.

However, the speed at which internal voltages are developed may be dependent on the rate that external voltages increase. Also, when the external voltage has reached a specified voltage, the rate at which internal voltages develop may be different than when the external voltage was increasing. It may be desirable to decrease the time for ramping up development of internal voltages for operation of the device and also adjust the rate of developing the internal voltage when the external voltage has reached an operating level.

DETAILED DESCRIPTION

Various embodiments of the present disclosure will be explained below in detail with reference to the accompanying drawings. The following detailed description refers to the accompanying drawings that show, by way of illustration, specific aspects and embodiments of the disclosure. The detailed description includes sufficient detail to enable those skilled in the art to practice the embodiments of the disclosure. Other embodiments may be utilized, and structural, logical and electrical changes may be made without departing from the scope of the present disclosure. The various embodiments disclosed herein are not necessary mutually exclusive, as some disclosed embodiments can be combined with one or more other disclosed embodiments to form new embodiments.

Figure 1:
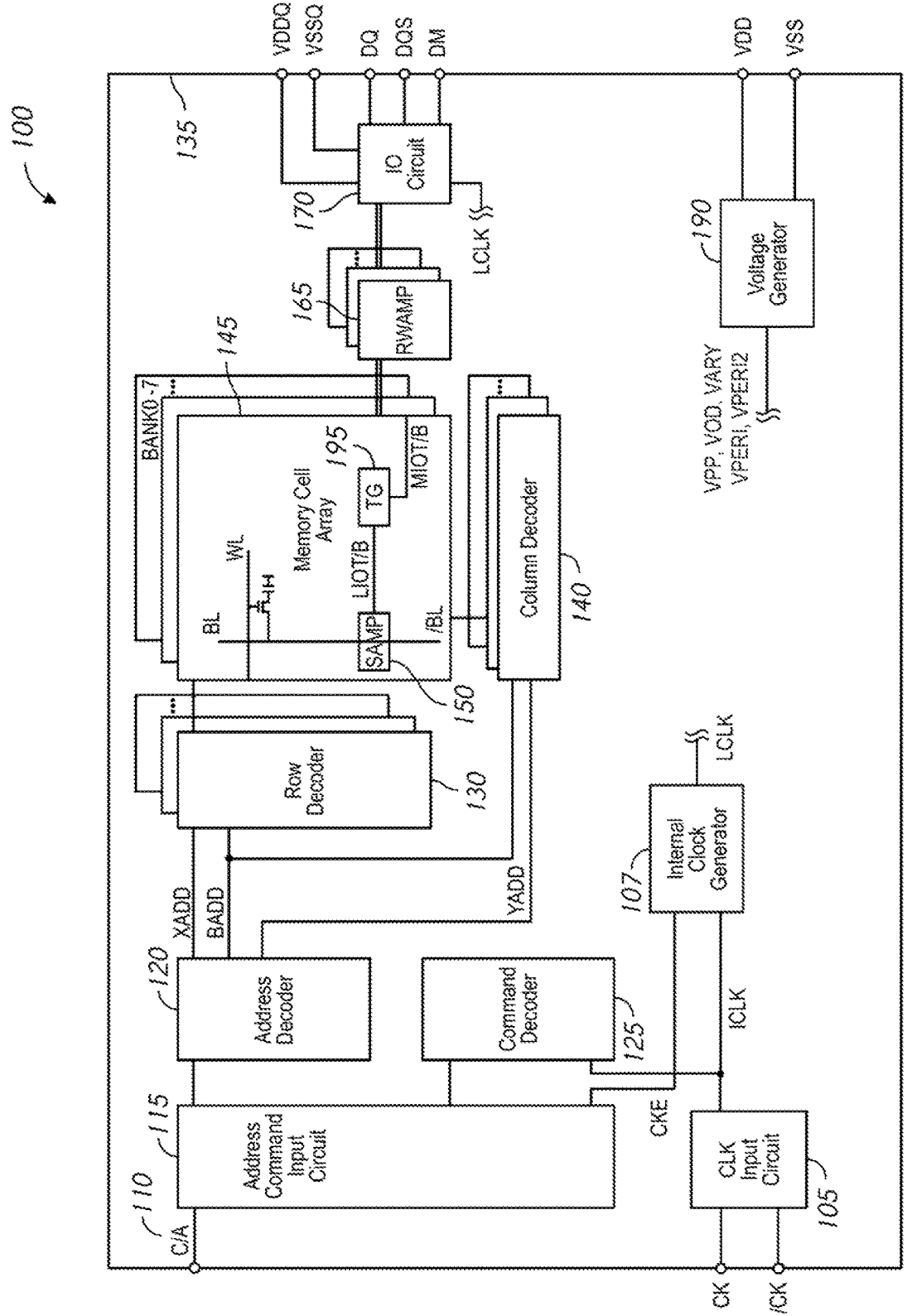
FIG. 1 is a block diagram of a semiconductor memory device, in accordance with an embodiment of the present disclosure.

FIG. 1 is a block diagram of a semiconductor device 100 according to an embodiment of the disclosure. The semiconductor memory device 100 may include a memory cell array 145. The memory cell array 145 includes a plurality of banks, each bank including a plurality of word lines WL, a plurality of bit lines BL, and a plurality of memory cells MC arranged at intersections of the plurality of word lines WL and the plurality of bit lines BL and /BL. The selection of the word line WL for each bank is performed by a corresponding row decoder 130 and the selection of the bit lines BL and /BL is performed by a corresponding column decoder 140. A plurality of sense amplifiers 150 are located for their corresponding bit lines BL and /BL, and coupled to at least one respective local I/O line LIOT/B further coupled to a respective one of at least two main I/O line pairs MIOT/B, via transfer gates TG 195, which function as switches.

An address/command input circuit 115 may receive an address signal and a bank address signal from outside at the command/address terminals via a command/address bus 110 and transmit the address signal and the bank address signal to an address decoder 120. The address decoder 120 may decode the address signal received from the address/command input circuit 115 and provide a row address signal XADD to the row decoder 130, and a column address signal YADD to the column decoder 140. The address decoder 120 may also receive the bank address signal and provide the bank address signal BADD to the row decoder 130 and the column decoder 140.

The address/command input circuit 115 may receive a command signal from outside, such as, for example, a memory controller 105 at the command/address terminals via the command/address bus 110 and provide the command signal to a command decoder 125. The command decoder 125 may decode the command signal and provide or generate various internal command signals. For example, the internal command signals may include a row command signal to select a word line, and a column command signal, such as a read command or a write command, to select a bit line.

When a row activation command is issued and a row address is timely provided with the activation command, and a column address is timely provided with the read command, read data is read from a memory cell in the memory cell array 145 designated by the row address and the column address. Read/write amplifiers 165 may receive the read data DQ and provide the read data DQ to an IO circuit 170. The IO circuit 170 may provide the read data DQ to outside via data terminals DQ, together with a data strobe signal at DQS. Similarly, when the row activation command is issued and a row address is timely provided with the activation command, and a column address is timely provided with the write command, the input/output circuit 170 may receive write data at the data terminals DQ, together with a data mask signal at DM and provide the write data via the read/write amplifiers 165 to the memory cell array 145. Thus, the write data may be written in the memory cell designated by the row address and the column address.

Turning to the explanation of the external terminals included in the semiconductor device 100, clock terminals CK and /CK may receive an external clock signal and a complementary external clock signal, respectively. The external clock signals (including complementary external clock signal) may be supplied to a clock input circuit 105. The clock input circuit 105 may receive the external clock signals and generate an internal clock signal ICLK. The clock input circuit 105 may provide the internal clock signal ICLK to an internal clock generator 107. The internal clock generator 107 may generate a phase controlled internal clock signal LCLK based on the received internal clock signal ICLK and a clock enable signal CKE from the address/command input circuit 115. The internal clock generator 107 may provide the phase controlled internal clock signal LCLK to the IO circuit 170. The IO circuit 170 may use the phase controller internal clock signal LCLK as a timing signal for determining an output timing of read data.

The power supply terminals may receive power supply voltages VDD and VSS. These power supply voltages VDD and VSS may be supplied to a voltage generator circuit 190.

The voltage generator circuit 190 may generate various internal voltages, VPP, VOD, VARY, VPERI, VPERI2, and the like based on the power supply voltages VDD and VSS. The internal voltage VPP is mainly used in the row decoder 130, the internal voltages VOD and VARY are mainly used in the sense amplifiers 150 included in the memory cell array 145, and the internal voltages VPERI and VPERI2 are used in many other circuit blocks. The voltage generator circuit 190 may include voltage circuits, for example, voltage pumps. A voltage pump may provide elevated voltages based on an input voltage. For example, the internal voltage VPP may be an elevated voltage based on a power supply voltage, such as VDD, and the internal voltage VPERI2 may be an elevated voltage based on the internal voltage VPERI. The power supply terminals may also receive power supply voltages VDDQ and VSSQ. The IO circuit 170 may receive the power supply voltages VDDQ and VSSQ. For example, the power supply voltages VDDQ and VSSQ may be the same voltages as the power supply voltages VDD and VSS, respectively. However, the dedicated power supply voltages VDDQ and VSSQ may be used for the 10 circuit 170.

Figure 2:
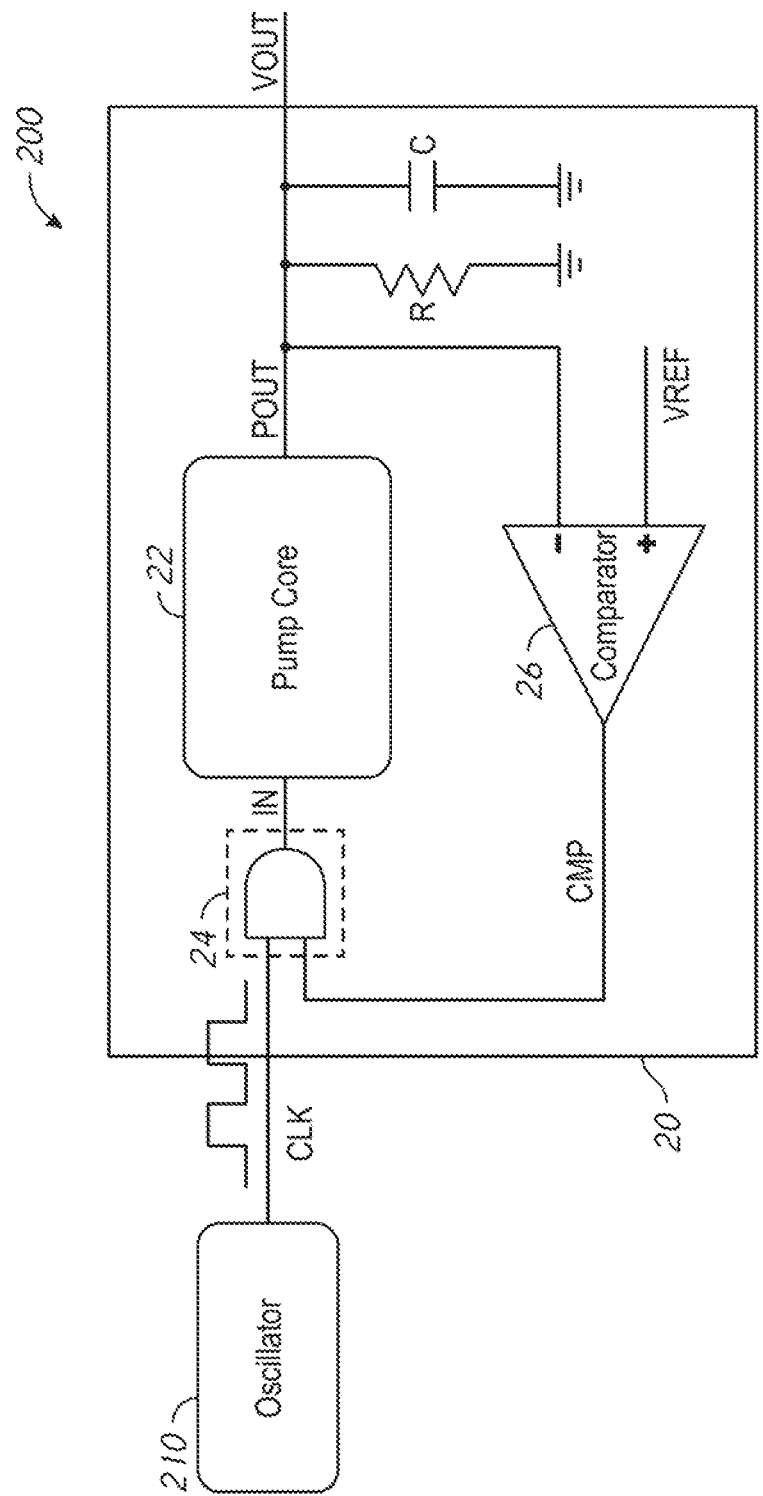
FIG. 2 is a block diagram of voltage pump according to an embodiment of the disclosure.

FIG. 2 is a block diagram of voltage pump 200 according to an embodiment of the disclosure. The voltage pump 200 may be included in the voltage generator 190 of FIG. 1 in some embodiments of the disclosure.

The voltage pump 200 includes an oscillator 210 and voltage pump 20. The voltage pump 20 includes a pump core 22 that is provided pump input IN from a control circuit 24. The control circuit 24 is shown in FIG. 2 as an AND logic circuit. However, the control circuit 24 may include alternative or additional logic circuits in some embodiments of the disclosure. In response to the pump input IN, the pump core 22 provides a pump output POUT to a resistance R and a capacitance C, which results in an output voltage VOUT. The pump output POUT may be an output current, an output voltage, or a combination of output current and voltage. The VOUT voltage may increase as the pump core 22 provides the pump output POUT and may increase to a voltage greater than a voltage of the pump input IN provided to the pump core 22. The VOUT voltage is also provided to a comparator 26. The comparator 26 is also provided a reference voltage VREF. The comparator 26 compares the voltage between the VOUT voltage and the reference voltage VREF, and provides an output signal CMP to the control circuit 24. A logic level of the output signal CMP may be based on the voltage of the VOUT voltage relative to the reference voltage VREF. For example, when the voltage of the VOUT voltage is less than the reference voltage VREF, the comparator 26 provides the output signal CMP having a high logic level. Conversely, when the voltage of the VOUT voltage is greater than the reference voltage VREF, the comparator 26 provides the output signal CMP having a low logic level. The reference voltage VREF may be a target voltage for VOUT in some embodiments of the disclosure. In embodiments of the disclosure with the voltage pump 200 included in the voltage generator 190 of FIG. 1, the VOUT voltage may represent VPP, VPERI2, or another voltage provided by the voltage generator 190.

The oscillator 210 provides an output signal CLK to the control circuit 24. The oscillator 210 may provide an active output signal CLK when activated and an inactive output signal CLK when deactivated. The active output signal CLK may be a periodic signal that periodically changes between a high level and a low level, for example, a clock. The inactive output signal CLK may have a constant level. The oscillator 210 may include delay circuits (not shown in FIG. 2) that are used to provide the output signal CLK. The delay circuits may provide respective delays that are used to change a timing of a signal provided to the delay circuits. The signal having the altered timing may be used to provide the output signal CLK. A frequency of the output signal CLK may be based on the respective delays of the delay circuits. As a result, changing the respective delays will change the frequency of the output signal CLK. In some embodiments of the disclosure, the respective delays change with a change in power supply voltage. As a result, the frequency of the output signal CLK may change with a change in power supply voltage. For example, as the power supply voltage increases, the frequency of the output signal CLK decreases.

In operation, the control circuit 24 may provide the pump input IN as controlled by the CMP signal from the comparator 26. For example, when the CMP signal has a low logic level, the control circuit 24 provides a low logic level pump input IN (e.g., an inactive pump input IN), which has a low level voltage. The low level voltage may be a reference voltage, such as ground. When the CMP signal has a high logic level, the control circuit 24 provides the pump input IN based on the CLK signal from the oscillator 210. For example, assuming a high logic level CMP signal, when the oscillator 210 provides an active CLK signal, the pump input IN provided by the control circuit 24 periodically changes between the high level voltage and the low level voltage (e.g., an active pump input IN), and has a frequency based on the frequency of the CLK signal. The pump input IN may drive the pump core 22 to provide the pump output POUT to the resistance R and the capacitance C, resulting in the VOUT voltage. As previously described, the VOUT voltage increases as the pump core 22 provides the pump output POUT.

As previously described, when the VOUT voltage is less than the VREF voltage the comparator 26 provides the high logic level CMP signal, which controls the control circuit 24 to provide the active pump input IN to drive the pump core 22 and provide the pump output POUT. In turn, the VOUT voltage continues to increase. When the VOUT voltage exceeds the VREF voltage, however, the comparator 26 provides the low logic level CMP signal, which controls the control circuit 24 to provide the inactive pump input IN. With the inactive pump input IN, the pump core 22 is no longer driven to provide a pump output POUT to that increase the VOUT voltage. The VOUT voltage may decrease in time due to leakage currents, until the VOUT voltage decreases to less than the VREF voltage. At that time, the comparator 26 provides the high logic level CMP signal to again control the control circuit 24 to provide the active pump input IN to drive the pump core 22 to provide the pump output POUT and increase the VOUT voltage. In this manner, the VOUT voltage may be regulated to be about the same voltage as the VREF voltage.

Figure 3:
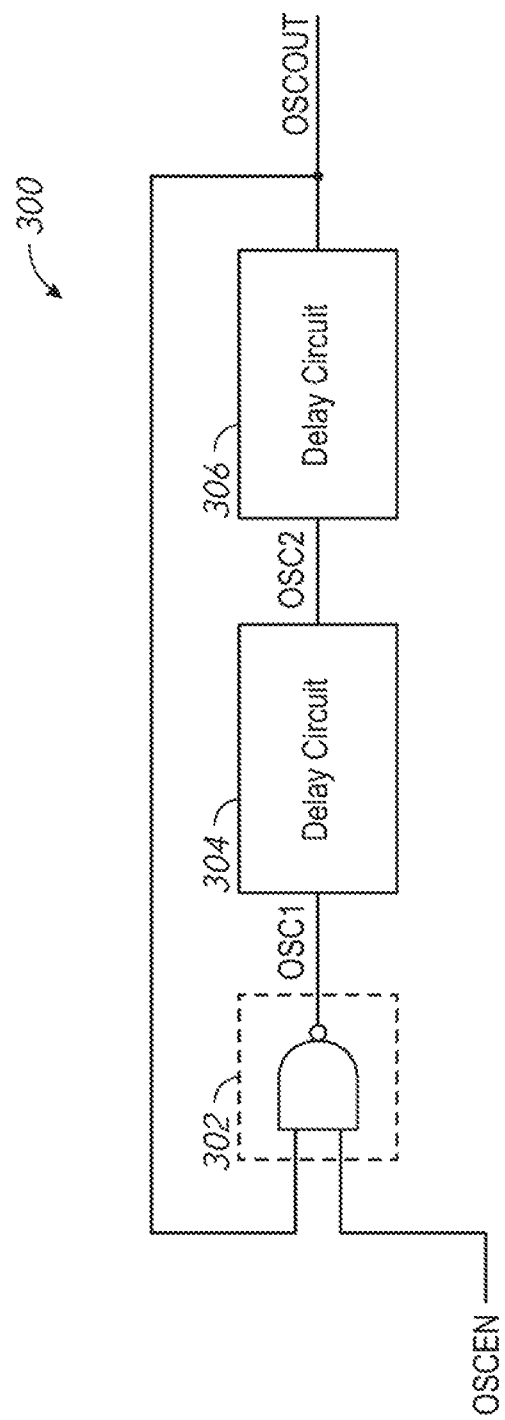
FIG. 3 is a block diagram of an oscillator according to an embodiment of the disclosure.

FIG. 3 is a block diagram of an oscillator 300 according to an embodiment of the disclosure. The oscillator 300 may be included in the voltage generator 190 of FIG. 1 and/or the oscillator 210 of FIG. 2 in some embodiments of the disclosure.

The oscillator 300 includes an enable circuit 302 and delay circuits 304 and 306. The enable circuit 302 is shown in FIG. 3 as a NAND logic circuit. However, the enable circuit 302 may include alternative or additional logic circuits in some embodiments of the disclosure. The enable circuit 302 is provided an enable signal OSCEN and an output signal OSCOUT provided by the delay circuit 306. When the OSCEN signal is inactive (e.g., inactive low logic level), the enable circuit 302 provides an output signal OSC1 having a high logic level (e.g., having a high level voltage). When the OSCEN signal is active (e.g., active high logic level), the enable circuit 302 provides the OSC1 signal having a logic level that is complementary to the logic level of the OSCOUT signal. The OSC1 signal is provided to the delay circuit 304. The delay circuit 304 provides an output signal OSC2 having a delay D1 relative to the OSC1 signal. The OSC2 signal is provided to the delay circuit 306. The delay circuit 306 provides the OSCOUT signal having a delay D2 relative to the OSC2 signal. In embodiments of the disclosure with the oscillator 300 included in the oscillator 210 of FIG. 2, the OSCOUT signal represents the output signal CLK.

In operation, when an inactive OSCEN signal is provided to the enable circuit 302, the oscillator 300 provides an OSCOUT signal having a constant low logic level (e.g., an inactive OSCOUT signal). When an active OSCEN signal is provided to the enable circuit 302, the oscillator 300 provides an OSCOUT signal that periodically changes between high and low logic levels (e.g., an active OSCOUT signal). The period of the active OSCOUT signal may be based on the delays D1 and D2 of the delay circuits 304 and 306. For example, the period of the active OSCOUT signal may be approximately 2×(D1+D2), where the propagation delay of the enable circuit 302 is ignored. The period of the active OSCOUT signal may change as the delays D1 and D2 change. For example, the period of the active OSCOUT signal increases as one or both of the delays D1 and D2 increase, and the period of the active OSCOUT signal decreases (and the frequency of the OSCOUT signal increases) as one or both of the delays D1 and D2 decrease. Thus, the period of the active OSCOUT signal may be changed by changing the delays D1 and/or D2 of the delay circuits 304 and 306. In some embodiments of the disclosure, the delays D1 and D2 of the delay circuits 304 and 306 change with a change in power supply voltage. As a result, the period of the active OSCOUT signal may change with a change in power supply voltage. For example, as the power supply voltage increases, the period of the active OSCOUT signal increases (and the frequency of the OSCOUT signal decreases).

Figure 4:
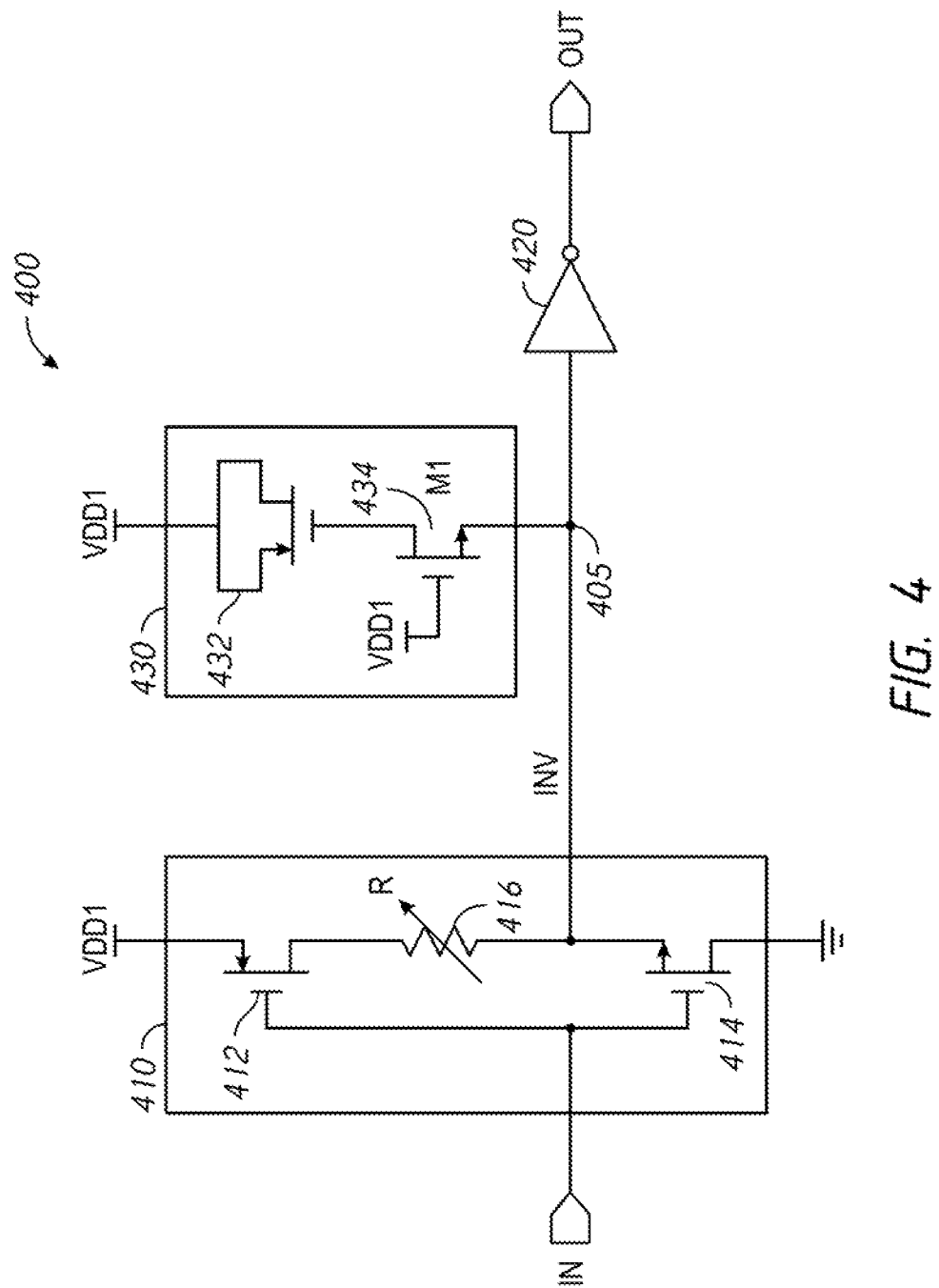
FIG. 4 is a schematic diagram of a delay circuit according to an embodiment of the disclosure.

FIG. 4 is a schematic diagram of a delay circuit 400 according to an embodiment of the disclosure. The delay circuit 400 may be included in the delay circuit 304 and/or 306 in some embodiments of the disclosure.

The delay circuit 400 includes inverter circuit 410 coupled in series with inverter circuit 420. The delay circuit 400 further includes an impedance circuit 430 coupled to the inverter circuits 410 and 420 at node 405. The inverter circuit 410 includes transistor 412 that is provided a voltage from a voltage supply and includes transistor 414 that is provided a reference voltage (e.g., ground). In some embodiments of the disclosure, the transistor 412 may be a p-channel field effect transistor (pFET) and the transistor 414 may be an n-channel field effect transistor (nFET). The transistor 412 is provided a voltage from a power supply (e.g., VDD1) and the transistor 414 is provided a reference voltage (e.g., ground). The power supply VDD1 may be used for generating an internal power supply voltage having a higher voltage than VDD1. The higher voltage may be used for circuits various circuits, for example, analog circuits that require higher voltage levels than the power supply VDD1. In some embodiments of the disclosure, the VDD1 may be 1.8 volts.

An input signal IN is provided to the inverter circuit 410, which is provided to gates of the transistors 412 and 414. The inverter circuit 410 further includes resistance 416 coupled to drains of the transistors 412 and 414. In some embodiments of the disclosure, the resistance 416 is a trimmable resistance circuit, where the resistance R may be maybe trimmed to provide a desired resistance. The resistance R may be trimmed to provide a desired delay. For example, a stable power supply may be provided to the delay circuit 400 and the resistance R trimmed during manufacturing to provide a desired (e.g., known) delay. Trimming to increase the resistance R may increase the delay while trimming to decrease the resistance R may decrease the delay.

The inverter circuit 410 provides an output signal INV at the node 405. The INV signal has a logic level that is complementary to a logic level of the IN signal. The INV signal is provided to the impedance circuit 430. The inverter circuit 420 provides an output signal OUT having a logic level that is complementary to the logic level of the INV signal.

The impedance circuit 430 includes a capacitance 432 and voltage controlled resistance 434. The impedance circuit 430 provides an impedance to the node 405 based on a capacitance of the capacitance 432 and a resistance of the voltage controlled resistance 434. For example, the impedance of the impedance circuit 430 may be the product of the capacitance of the capacitance 432 and the resistance of the voltage controlled resistance 434. The capacitance 432 is shown as a p-channel field effect transistor (pFET) and the voltage controlled resistance 434 is shown as an n-channel field effect transistor (nFET). In some embodiments of the disclosure, the threshold voltage Vtn of the nFET is about 0.7 volts. nFETs having other transistor characteristics may be used in other embodiments of the disclosure. The nFET may operate in the linear range so that as the voltage of the power supply changes, the resistance of the nFET may change in a relatively linear manner. As previously described, the resistance R of the inverter circuit 410 may be trimmed to provide a desired resistance. In some embodiments of the disclosure, the capacitance 432 may be trimmed to provide a desired resistance, for example, for a particular power supply voltage.

In some embodiments of the disclosure, additional and/or alternative circuits may be used for the impedance circuit. For example, in some embodiments of the disclosure the impedance circuit may include a voltage controlled resistance 434 that includes a plurality of nFETs coupled in parallel, a plurality of nFETs coupled in series, or a plurality of nFETs having various combinations of nFETs coupled in parallel and/or series. In some embodiments of the disclosure the impedance circuit may include a voltage controlled resistance 434 and a capacitance 432 including, respectively, a pFET and an nFET. However, the voltage controlled resistance 434 coupled to the capacitance 432 including the pFET may include a plurality of pFETs coupled in parallel, a plurality of pFETs coupled in series, or a plurality of pFETs having various combinations of plurality of pFETs coupled in parallel and/or series.

The capacitance 432 is provided a voltage from a power supply (e.g., VDD1). The voltage controlled resistance 434 is provided a voltage from a power supply (e.g., VDD1) and provides a resistance that is based on the voltage. For example, as the voltage increases, the resistance of the voltage controlled resistance 434 decreases and as the voltage decreases, the resistance of the voltage controlled resistance increases. As a result, the impedance of the impedance circuit 430 changes as the voltage from the power supply changes. For example, as the voltage increases (and the resistance decreases), the capacitance of the capacitance 432 increases, and as the voltage decreases (and the resistance increases), the capacitance of the capacitance 432 decreases.

The magnitude of voltage noise in the changing voltage of the power supply (e.g., VDD1) is relatively small. The variation of the voltage level of noise (e.g., +/−50 mV or +/−100 mv) on the power supply voltage is around 5% compared to the level of the power supply voltage (e.g., 1.8V). In order to improve the consistency of the delay, the impedance circuit may compensate for low frequency noise. The delay is decreased when noise in the power supply voltage causes the voltage level of the power supply to become lower. The delay is increased when noise in the power supply voltage causes the voltage level of the power supply to become higher.

In operation, the delay circuit 400 provides the OUT signal having a delay relative to the IN signal. The IN signal is inverted by the inverter circuit 410 to provide the INV signal, and the inverter circuit 420 inverts the INV signal to provide the OUT signal. The resulting OUT signal has a same logic level as the IN signal and has a delay relative to the IN signal.

The delay of the OUT signal relative to the IN signal may be based on the impedance of the impedance circuit 430. The impedance of the impedance circuit 430 may affect a transition time of the INV signal provided by the inverter circuit 410. The transition time of the INV signal is the time for the INV signal to change from a low logic level to a high logic level and/or to change from the high logic level to the low logic level. The transition time of the INV signal increases as the impedance (e.g., the capacitance of the capacitance 432) of the impedance circuit 430 increases and the transition time of the INV signal decreases as the impedance of the impedance circuit 430 decreases. As a result, the time for the IN signal to propagate through the inverters 410 and 420 to provide the OUT signal increases when the impedance increases and decreases as the impedance decreases. In some embodiments of the disclosure, for example, as shown in FIG. 4, the transition time of rising transitions of the INV signal may be affected by the impedance of the impedance circuit 430, and falling transitions of the INV signal less so. As a result, the delay of the delay circuit 400 is increased or decreased based on changes in transition times for rising transitions of the INV signal more so than for falling transitions of the INV signal. In such embodiments, the delay circuit may be described as delaying falling edges of the input signal IN.

As previously described, the impedance of the impedance circuit 430 changes as the power supply voltage provided to the impedance circuit 430 changes. For example, as also previously described, as the power supply voltage increases, the resistance decreases and the capacitance of the capacitance 432 increases, and as the power supply voltage decreases, the resistance increases and the capacitance of the capacitance 432 decreases.

Combining the effects of the changing impedance of the impedance circuit 430 with the changing transition time for the INV signal, results in the delay circuit 400 providing a delay that increases as the power supply voltage increases and providing a delay that decreases as the power supply voltage decreases. Described in another way, the delay of the delay circuit 400 is relatively short for relatively low power supply voltage and the delay of the delay circuit 400 is relatively long for a relatively high power supply voltage.

In embodiments of the disclosure where the delay circuit 400 is included in an oscillator, the frequency of the output signal may be based on the power supply voltage. For example, with reference to FIG. 3, when the oscillator 300 is enabled by an active OSCEN signal, the frequency of the OSCOUT signal decreases (and the period of the OSCOUT signal increases) as the power supply voltage increases. Conversely, the frequency of the OSCOUT signal increases (and the period of the OSCOUT signal decreases) as the power supply voltage decreases. Described in another way, the frequency of the OSCOUT signal is relatively low for relatively high power supply voltage and the frequency of the OSCOUT signal is relatively high for relatively low power supply voltage.

Thus, in an example application with a voltage pump (e.g., voltage pump 200 of FIG. 2), the previously described example oscillator will drive a pump core with a relatively high frequency output signal to more quickly develop the pumped output voltage when the power supply voltage is relatively low. As the power supply voltage increases, however, the frequency of the output signal provided by the oscillator will decrease, thus, driving the pump core to develop the pumped output voltage less quickly.

Figure 5:
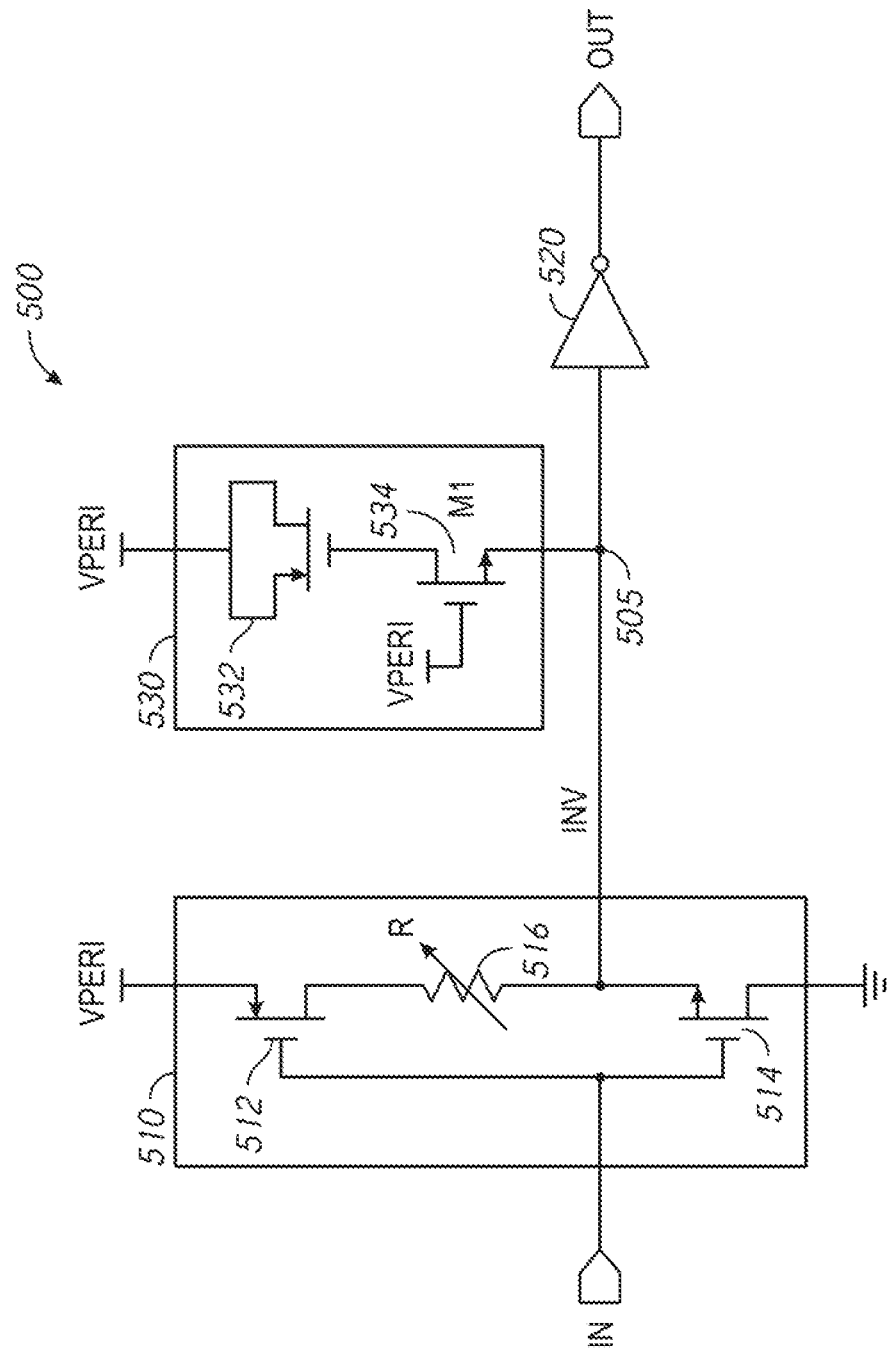
FIG. 5 is a schematic diagram of a delay circuit according to an embodiment of the disclosure.

FIG. 5 is a schematic diagram of a delay circuit 500 according to an embodiment of the disclosure. The delay circuit 500 may be included in the delay circuit 304 and/or 306 in some embodiments of the disclosure.

The delay circuit 500 includes inverter circuit 510 coupled in series with inverter circuit 520. The delay circuit 500 also includes an impedance circuit 530 coupled to the inverter circuits 510 and 520 at node 505. The inverter circuit 510 includes transistor 512 that is provided a voltage from a voltage supply and includes transistor 514 that is provided a reference voltage (e.g., ground). In some embodiments of the disclosure, the transistors 512 and 514 may be a pFET and an nFET, respectively. A voltage from a peripheral circuit power supply (e.g., VPERI) is provided to the transistor 512. The transistor 514 is provided a reference voltage (e.g., ground). The peripheral circuit power supply VPERI may provide a voltage that is used for generating a power supply voltage with a relatively lower level than the power supply voltage generated using the power supply VDD1. For example, the relatively lower voltage generated using the power supply VPERI may be used by logic control circuits. In some embodiments of the disclosure, the VPERI may be 1.1 to 1.2 volts.

The inverter circuit 510 receives an input signal IN that is provided to gates of the transistors 512 and 514. The inverter circuit 510 further includes resistance 516 coupled to drains of the transistors 512 and 514. The resistance 516 is a trimmable resistance circuit, where the resistance R may be maybe trimmed to provide a desired resistance. The resistance R may be trimmed to provide a desired delay. For example, a stable power supply may be provided to the delay circuit 500 and the resistance R trimmed during manufacturing to provide a desired (e.g., known) delay. Trimming to increase the resistance R may increase the delay while trimming to decrease the resistance R may decrease the delay.

The inverter circuit 510 of FIG. 5 provides an output signal INV at the node 505. The INV signal has a logic level that is complementary to a logic level of the IN signal. The INV signal is provided to the impedance circuit 530. The inverter circuit 520 provides an output signal OUT having a logic level that is complementary to the logic level of the INV signal.

The impedance circuit 530 includes a capacitance 532 and voltage controlled resistance 534. The impedance circuit 530 provides an impedance to the node 505 based on a capacitance of the capacitance 532 and a resistance of the voltage controlled resistance 534. For example, the impedance of the impedance circuit 530 may be the product of the capacitance of the capacitance 532 and the resistance of the voltage controlled resistance 534. The capacitance 532 is shown as a pFET and the voltage controlled resistance 534 is shown as an nFET. The threshold voltage Vtn of the nFET in the impedance circuit 530 of FIG. 5 is about 0.3 or 0.4 volts. nFETs having other transistor characteristics may be used as in the voltage controlled resistance 534 of FIG. 5. The nFET may operate in the linear range so that as the voltage of the peripheral circuit power supply changes, the resistance of the nFET may change in a relatively linear manner. As previously described, the resistance R of the inverter circuit 510 may be trimmed to provide a desired resistance. In some embodiments of the disclosure, the capacitance 532 may be trimmed to provide a desired resistance, for example, for a particular power supply voltage.

In some embodiments of the disclosure, additional and/or alternative circuits may be used for the impedance circuit. For example, in some embodiments of the disclosure the impedance circuit may include a voltage controlled resistance 534 that includes a plurality of nFETs coupled in parallel, a plurality of nFETs coupled in series, or a plurality of nFETs having various combinations of nFETs coupled in parallel and/or series. In some embodiments of the disclosure the impedance circuit may include a voltage controlled resistance 534 and a capacitance 532 including, respectively, a pFET and an nFET. However, the voltage controlled resistance 534 coupled to the capacitance 532 including the nFET may include a plurality of pFETs coupled in parallel, a plurality of pFETs coupled in series, or a plurality of pFETs having various combinations of plurality of pFETs coupled in parallel and/or series.

A voltage from the peripheral circuit power supply is provided to the capacitance 532. The voltage controlled resistance 534 is provided a voltage from the peripheral circuit power supply and provides a resistance that is based on the voltage. For example, as the voltage increases, the resistance of the voltage controlled resistance 534 decreases and as the voltage decreases, the resistance of the voltage controlled resistance increases. As a result, the impedance of the impedance circuit 530 changes as the voltage from the peripheral circuit power supply changes. For example, as the voltage increases (and the resistance decreases), the capacitance of the capacitance 532 increases, and as the voltage decreases (and the resistance increases), the capacitance of the capacitance 532 decreases.

The magnitude of voltage noise in the changing voltage of the peripheral circuit power supply (e.g., VPERI) is relatively small. The range of the level of voltage of noise (e.g., +/−50 mV or +/−100 mv) on the peripheral circuit power supply voltage is around 10% compared to the level of the peripheral circuit power supply voltage (e.g., 1.1 V or 1.2V). In order to improve the consistency of the delay, the impedance circuit may compensate for low frequency noise. The delay is decreased when noise in the power supply voltage causes the voltage level of the power supply to become lower. The delay is increased when noise in the power supply voltage causes the voltage level of the power supply to become higher.

The delay circuit 500 provides the OUT signal having a delay relative to the IN signal. The IN signal is inverted by the inverter circuit 510 to provide the INV signal, and the inverter circuit 520 inverts the INV signal to provide the OUT signal. The resulting OUT signal has a same logic level as the IN signal and has a delay relative to the IN signal.

The delay of the OUT signal relative to the IN signal may be based on the impedance of the impedance circuit 530. The impedance of the impedance circuit 530 may affect a transition time of the INV signal provided by the inverter circuit 510. The transition time of the INV signal is the time for the INV signal to change from a low logic level to a high logic level and/or to change from the high logic level to the low logic level. The transition time of the INV signal increases as the impedance (e.g., the capacitance of the capacitance 532) of the impedance circuit 530 increases and the transition time of the INV signal decreases as the impedance of the impedance circuit 530 decreases. As a result, the time for the IN signal to propagate through the inverters 510 and 520 to provide the OUT signal increases when the impedance increases and decreases as the impedance decreases. In some embodiments of the disclosure, for example, as shown in FIG. 5, the transition time of rising transitions of the INV signal may be affected by the impedance of the impedance circuit 530 and falling transitions of the INV signal less so. As a result, the delay of the delay circuit 500 is increased or decreased based on changes in transition times for rising transitions of the INV signal more so than for falling transitions of the INV signal. In such embodiments, the delay circuit may be described as delaying falling edges of the input signal IN.

As previously described, the impedance of the impedance circuit 530 changes as the power supply voltage provided to the impedance circuit 530 changes. For example, as also previously described, as the power supply voltage increases, the resistance decreases and the capacitance of the capacitance 532 increases, and as the power supply voltage decreases, the resistance increases and the capacitance of the capacitance 532 decreases.

Combining the effects of the changing impedance of the impedance circuit 530 with the changing transition time for the INV signal, results in the delay circuit 500 providing a delay that increases as the power supply voltage increases and providing a delay that decreases as the power supply voltage decreases. Described in another way, the delay of the delay circuit 500 is relatively short for relatively low power supply voltage and the delay of the delay circuit 500 is relatively long for a relatively high power supply voltage.

In embodiments of the disclosure where the delay circuit 500 is included in an oscillator, the frequency of the output signal may be based on the power supply voltage. For example, with reference to FIG. 3, when the oscillator 300 is enabled by an active OSCEN signal, the frequency of the OSCOUT signal decreases (and the period of the OSCOUT signal increases) as the power supply voltage increases. Conversely, the frequency of the OSCOUT signal increases (and the period of the OSCOUT signal decreases) as the power supply voltage decreases. Described in another way, the frequency of the OSCOUT signal is relatively low for relatively high power supply voltage and the frequency of the OSCOUT signal is relatively high for relatively low power supply voltage.

Thus, in an example application with a voltage pump (e.g., voltage pump 200 of FIG. 2), the previously described example oscillator will drive a pump core with a relatively high frequency output signal to more quickly develop the pumped output voltage when the power supply voltage is relatively low. As the power supply voltage increases, however, the frequency of the output signal provided by the oscillator will decrease, thus, driving the pump core to develop the pumped output voltage less quickly.

In some embodiments of the disclosure, other voltages may be used in place of VDD1 and VPERI. For example, a ground voltage may be used in place of VDD1 and VPERI. The impedance circuit may include a voltage controlled resistance and a capacitance that may include, a pFET, an nFET, or combinations thereof. The capacitance is provided a voltage from the ground voltage. The voltage controlled resistance is provided a voltage from a high level power supply, for example, VDD1/VPERI. The high level power supply voltage typically varies to a greater extent than the ground voltage. The voltage controlled resistance provides a resistance that is based on the voltage. For example, the resistance of the voltage controlled resistance that may be provided the high level power supply voltage changes responsive to a voltage of a charging node of the impedance circuit being raised or lowered. As a result, the impedance of the impedance circuit changes as the voltage from the power supply changes.

As previously described, the delay circuits 400 and 500 described with reference to FIGS. 4 and 5 delay falling edges of the input signal IN. In some embodiments of the disclosure, a delay circuit delays rising edges of an input signal IN. For example, in some embodiments of the disclosure, a delay circuit includes an inverter having a resistance coupled between a drain of a pull down circuit and a node to which an impedance circuit is coupled. The impedance circuit may include a voltage controlled resistance and capacitance coupled in series between the node and a reference voltage, for example, ground. The voltage controlled resistance may include a p-channel field effect transistor (e.g., pFET) having a gate coupled to the reference voltage. The example delay circuit may further include an inverter circuit having an input coupled to the node and provide an output signal OUT. In such an embodiment of the disclosure, the delay circuit delays rising edges of the input signal IN based on changes of the power supply voltage. As a result, the delay of the delay circuit changes with changes of the power supply voltage.

From the foregoing it will be appreciated that, although specific embodiments of the disclosure have been described herein for purposes of illustration, various modifications may be made without deviating from the spirit and scope of the disclosure. Accordingly, the scope of the disclosure should not be limited any of the specific embodiments described herein.

What is claimed is:

1. An apparatus comprising:
a voltage pump configured to provide an output voltage comprising:
a control circuit configured to provide a control signal;
a pump core configured to receive the control signal and configured to provide a pump output signal responsive at least in part to the control signal;
a resistance coupled between the pump core and a first voltage;
a capacitance coupled between the pump core and the first voltage parallel to the resistance, wherein the output voltage is provided at a node coupled to the pump core, resistance, and capacitance; and
a comparator configured to receive the pump output signal and a reference voltage and provide a comparator output signal to the control circuit; and
an oscillator configured to provide an oscillating output signal when enabled, the oscillator including a delay circuit, wherein a frequency of the oscillating output signal is based at least in part on a delay of the delay circuit, the delay circuit including an inverter having an output node and an impedance circuit coupled to the output node, wherein the impedance circuit is configured to receive a second voltage and have an impedance that changes responsive to the second voltage, wherein the delay is based, at least in part, on the impedance,
wherein the oscillating output signal is provided to the control circuit and the control signal is based at least in part, on the oscillating output signal and the comparator output signal such that the output voltage of the voltage pump is based, at least in part, on the frequency of the oscillating output signal.

2. The apparatus of claim 1, wherein the impedance circuit comprises a second resistance and a second capacitance, and the impedance of the impedance circuit is based on the second resistance and the second capacitance.

3. The apparatus of claim 2, wherein the second resistance comprises an n-channel field effect transistor (nFET) configured to receive the voltage, and the second capacitance comprises a p-channel field effect transistor (pFET) configured to receive the voltage.

4. The apparatus of claim 1, wherein the impedance circuit comprises a voltage controlled resistance comprising a transistor configured to receive the second voltage, and
wherein the impedance of the impedance circuit is based, at least in part, on the second voltage received by the voltage controlled resistance.

5. The apparatus of claim 1, wherein the impedance circuit comprises a voltage controlled resistance including a transistor,
wherein the transistor is configured to receive the second voltage, and
wherein the second voltage is a power supply voltage of the delay circuit.

6. The apparatus of claim 1, wherein the impedance circuit comprises a first transistor, and
wherein the first transistor is coupled to the output node and configured to be activated, responsive to the second voltage received at a gate of the first transistor, to provide a third voltage to the output node.

7. The apparatus of claim 6, wherein the impedance circuit further comprises a second transistor configured to receive the second voltage at a source and a drain, and a gate of the second transistor is coupled to the first transistor, and
wherein the first transistor is further configured to receive, via the second transistor, the third voltage provided to the output node.

8. The apparatus of claim 3,
wherein the second voltage comprises a peripheral circuit power supply voltage.

9. The apparatus of claim 1, wherein the inverter comprises first and second transistors, and a trimmable resistance circuit coupled between the first transistor and the output node.

10. The apparatus of claim 9, wherein the delay of the delay circuit is based, at least in part, on the impedance of the impedance circuit, and the trimmable resistance circuit.

11. An apparatus comprising:
a memory comprising:
a voltage pump configured to provide an output voltage comprising:
a control circuit configured to provide a control signal;
a pump core configured to receive the control signal and configured to provide a pump output signal responsive at least in part to the control signal;
a resistance coupled between the pump core and a first voltage;

a capacitance coupled between the pump core and the first voltage parallel to the resistance, wherein the output voltage is provided at a node coupled to the pump core, resistance, and capacitance; and a comparator configured to receive the pump output signal and a reference voltage and provide a comparator output signal to the control circuit; and an oscillator coupled to the voltage pump, the oscillator including a delay circuit and configured to provide an oscillating output signal to the voltage pump having a frequency based on a delay of the delay circuit, the delay circuit including an inverter having an output node and an impedance circuit coupled to the output node, wherein the impedance circuit is configured to receive a second voltage and have an impedance that changes responsive to the second voltage, wherein the delay is based, at least in part, on the impedance, wherein the oscillating output signal is provided to the control circuit and the control signal is based at least in part, on the oscillating output signal and the comparator output signal such that the output voltage of the voltage pump is based, at least in part, on the frequency of the oscillating output signal.

12. The apparatus of claim 11, wherein the impedance circuit comprises a voltage controlled resistance including a transistor configured to receive the second voltage, wherein the impedance of the impedance circuit is based, at least in part, on the second voltage received by the voltage controlled resistance.

13. The apparatus of claim 11, wherein the impedance circuit comprises a second resistance including an n-channel field effect transistor (nFET), wherein the nFET is configured to receive the second voltage, and wherein the second voltage is a peripheral voltage of a peripheral circuit of the memory.

14. The apparatus of claim 13, wherein the impedance circuit comprises a second capacitance including a p-channel field effect transistor (pFET), wherein the inverter includes first and second transistors, and a trimmable resistance circuit coupled between the first transistor and the output node, and wherein the delay of the delay circuit is based, at least in part, on the nFET, the pFET, and the trimmable resistance circuit.

15. The apparatus of claim 11, wherein the impedance circuit comprises:

a second resistance including an n-channel field effect transistor (nFET) configured to receive the second voltage; and a second capacitance including a p-channel field effect transistor (pFET) configured to receive the second voltage, and wherein the delay of the delay circuit is based, at least in part, on the second voltage received by the nFET and the pFET.

16. The apparatus of claim 11, wherein the impedance circuit comprises first and second transistors, wherein a gate of the second transistor is coupled to the first transistor and a source and a drain of the second transistor are configured to receive the second voltage, and wherein the first transistor is coupled to the output node and configured to be activated, responsive to the second voltage received at a gate of the first transistor, to provide a third voltage received via the gate of the second transistor to the output node.

17. The apparatus of claim 14, wherein the delay circuit further comprises an inverter coupled between the inverter and the impedance circuit and the output node.

18. The apparatus of claim 11, wherein the oscillator comprises a plurality of delay circuits and the frequency of the oscillating output signal is based on delays of the plurality of delay circuits.

19. The apparatus of claim 1, wherein the control circuit comprises an AND gate.

20. The apparatus of claim 1, wherein the oscillator further includes an enable circuit configured to receive an enable signal.

* * * * *